United States Patent
Harikai et al.

(10) Patent No.: US 10,475,704 B2
(45) Date of Patent: Nov. 12, 2019

(54) METHOD OF MANUFACTURING ELEMENT CHIP AND ELEMENT CHIP

(71) Applicant: Panasonic Intellectual Property Management Co., Ltd., Osaka (JP)

(72) Inventors: Atsushi Harikai, Osaka (JP); Shogo Okita, Hyogo (JP); Noriyuki Matsubara, Osaka (JP); Mitsuru Hiroshima, Osaka (JP); Mitsuhiro Okune, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 94 days.

(21) Appl. No.: 15/408,703

(22) Filed: Jan. 18, 2017

(65) Prior Publication Data
US 2017/0229365 A1 Aug. 10, 2017

(30) Foreign Application Priority Data
Feb. 4, 2016 (JP) ................... 2016-019868

(51) Int. Cl.
*H01L 21/78* (2006.01)
*H01L 21/683* (2006.01)
*H01L 21/311* (2006.01)
*H01L 21/02* (2006.01)
*H01L 21/3065* (2006.01)
(Continued)

(52) U.S. Cl.
CPC .......... *H01L 21/78* (2013.01); *H01L 21/0212* (2013.01); *H01L 21/02274* (2013.01); *H01L 21/30655* (2013.01); *H01L 21/31138* (2013.01); *H01L 21/6835* (2013.01); *H01L 21/6836* (2013.01); *H01L 23/3185* (2013.01);
(Continued)

(58) Field of Classification Search
None
See application file for complete search history.

(56) References Cited

U.S. PATENT DOCUMENTS

| | | | |
|---|---|---|---|
| 5,501,893 A * | 3/1996 | Laermer | H01L 21/3065 216/67 |
| 6,303,512 B1 * | 10/2001 | Laermer | H01L 21/30655 257/E21.218 |

(Continued)

FOREIGN PATENT DOCUMENTS

| | | |
|---|---|---|
| JP | 2002-093752 A | 3/2002 |
| JP | 2004-095952 A | 3/2004 |

(Continued)

*Primary Examiner* — Erik T. K. Peterson
(74) *Attorney, Agent, or Firm* — Pearne & Gordon LLP

(57) ABSTRACT

In a plasma processing step that is used in the method of manufacturing the element chip for manufacturing a plurality of element chips by dividing a substrate having a plurality of element regions, the substrate is divided into element chips 10 by exposing the substrate to a first plasma. Therefore, element chips having a first surface, a second surface, and a side surface connecting the first surface and the second surface are held spaced from each other on a carrier. A protection film covering the element chip is formed only on the side surface and it is possible to suppress creep-up of a conductive material to the side surface in the mounting step by exposing the element chips to second plasma in which a mixed gas of fluorocarbon and helium is used as a raw material gas.

12 Claims, 7 Drawing Sheets

(51) Int. Cl.
*H01L 23/31* (2006.01)
*H01L 23/29* (2006.01)

(52) U.S. Cl.
CPC ........ *H01L 23/293* (2013.01); *H01L 23/3157* (2013.01); *H01L 2223/5446* (2013.01)

(56) References Cited

U.S. PATENT DOCUMENTS

| | | | | |
|---|---|---|---|---|
| 6,406,979 B2* | 6/2002 | Fischer | ................ | H01L 21/3043 |
| | | | | 257/E21.238 |
| 8,012,805 B2* | 9/2011 | Arita | ................... | H01L 21/3065 |
| | | | | 438/113 |
| 8,383,436 B2* | 2/2013 | Arita | ................ | H01J 37/32082 |
| | | | | 438/113 |
| 9,299,576 B2* | 3/2016 | Oda | ....................... | H01L 21/308 |
| 9,299,579 B2* | 3/2016 | Tomura | ............ | H01L 21/76897 |
| 9,847,270 B2* | 12/2017 | Carney | ............... | H01L 23/3185 |
| 9,859,144 B2* | 1/2018 | Harikai | ............... | H01L 21/6836 |
| 2004/0043614 A1 | 3/2004 | Koizumi | | |
| 2005/0072766 A1 | 4/2005 | Arita | | |
| 2006/0189144 A1* | 8/2006 | Krawczyk | ........... | B81C 1/00531 |
| | | | | 438/710 |
| 2008/0093338 A1* | 4/2008 | Okune | ............. | H01J 37/32091 |
| | | | | 216/41 |
| 2009/0023295 A1* | 1/2009 | Arita | .................... | H01L 21/3065 |
| | | | | 438/710 |
| 2009/0093104 A1 | 4/2009 | Arita et al. | | |
| 2010/0048001 A1* | 2/2010 | Harikai | .............. | H01J 37/32743 |
| | | | | 438/464 |
| 2010/0120227 A1* | 5/2010 | Grivna | .................... | H01L 21/78 |
| | | | | 438/462 |
| 2010/0120230 A1* | 5/2010 | Grivna | .................... | H01L 21/78 |
| | | | | 438/464 |
| 2010/0124246 A1* | 5/2010 | Lutgen | ................ | H01L 33/0095 |
| | | | | 372/50.1 |
| 2010/0173474 A1* | 7/2010 | Arita | ....................... | H01L 21/78 |
| | | | | 438/462 |
| 2010/0323469 A1* | 12/2010 | Borthakur | ......... | H01L 21/76898 |
| | | | | 438/65 |
| 2014/0070376 A1* | 3/2014 | Hess | ................. | H01L 21/30655 |
| | | | | 257/632 |
| 2014/0217556 A1* | 8/2014 | Peh | ......................... | H01L 21/78 |
| | | | | 257/620 |
| 2016/0064282 A1* | 3/2016 | Carney | ................ | H01L 21/78 |
| | | | | 257/737 |

FOREIGN PATENT DOCUMENTS

| | | |
|---|---|---|
| JP | 2004-265902 A | 9/2004 |
| JP | 2005-191039 A | 7/2005 |
| JP | 2006-303077 A | 11/2006 |

* cited by examiner

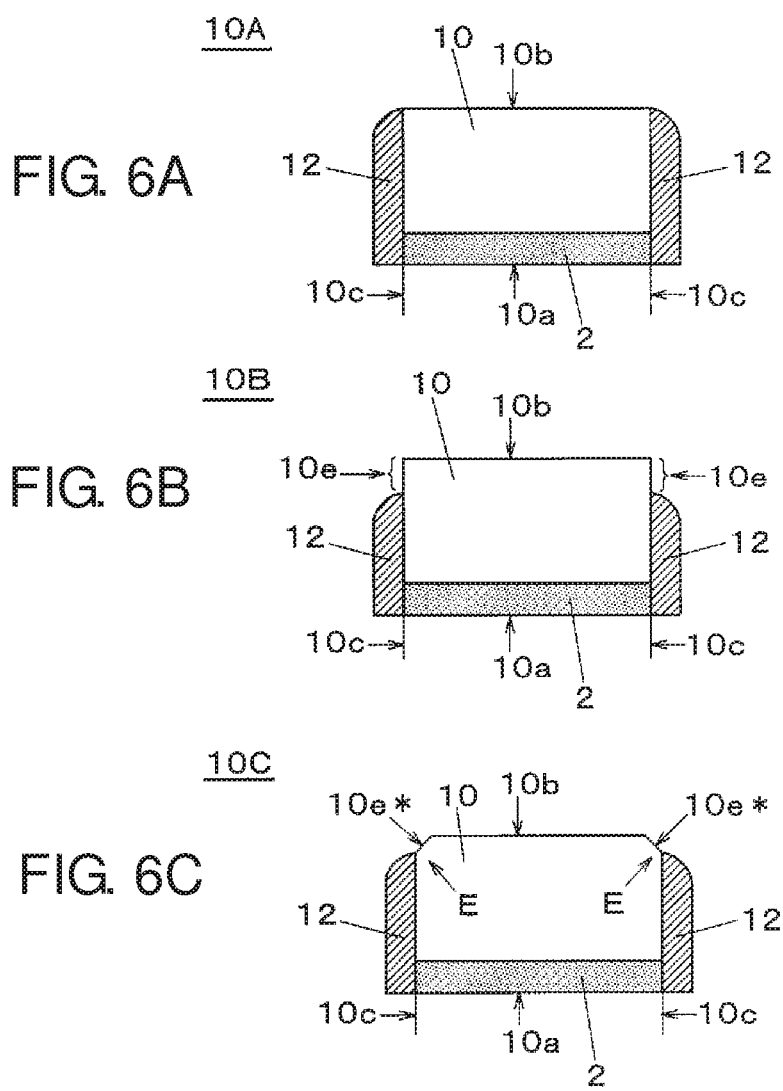

METHOD OF MANUFACTURING ELEMENT CHIP AND ELEMENT CHIP

BACKGROUND

1. Technical Field

The present disclosure relates to a method of manufacturing an element chip in which element chips are manufactured by dividing a substrate having a plurality of element regions for each element region and an element chip.

2. Description of the Related Art

An element chip such as a semiconductor element is manufactured by dividing a wafer substrate having a plurality of element regions into individual pieces (for example, see PTL 1). In the related art illustrated in PTL 1, first, a back surface of a wafer is polished and the wafer is thinned by etching in a state where a front surface of the wafer is stuck to a back grinding tape. Thereafter, a resist layer is formed in a portion corresponding to the element region for masking, and the wafer is subjected to plasma etching, thereby separating the wafer into individual pieces of the semiconductor elements.

CITATION LIST

Patent Literature

PTL 1: Japanese Patent Unexamined Publication No. 2002-93752

SUMMARY

An individual piece of the element chip that is cut out from the wafer substrate in the above-described manner may not only be used as a device after packaging is performed but also may be sent to an electronic component mounting step in a form of the element chip as it is as in a case of a Wafer Level Chip Size Package (WLCSP) or the like. In such a case, the element chip is mounted in a manner in which a circuit-formed surface comes directly into contact with a conductive material such as cream solder or silver paste for bonding.

An object of the disclosure is to provide a method of manufacturing an element chip in which creep-up of a conductive material in a mounting step can be suppressed.

A method of manufacturing an element chip of the disclosure, in which a plurality of element chips are formed by dividing a substrate, which includes a first surface having a plurality of element regions defined by dividing regions, and a second surface on a side opposite to the first surface, into the dividing regions, has the following features. The method of manufacturing the element chip includes a preparing step and a plasma processing step that is performed after the preparing step. A preparing step is a step of preparing the substrate in which the first surface side is supported on a carrier and an etching-resistant layer is formed so as to cover regions of the second surface opposite to the element regions and to expose regions of the second surface opposite to the dividing regions. A plasma processing step is a step of executing plasma processing on the substrate that is supported on a carrier and includes a dividing step, and a protection film forming step that is executed after the dividing step. In the dividing step, the substrate is divided into the element chips by etching the substrate of regions that are not covered by the etching-resistant layer in a depth direction of the substrate up to the first surface by exposing the second surface to the first plasma. Therefore, the element chips including the first surface, the second surface, and a side surface connecting the first surface and the second surface is caused to be in a state of being held spaced from each other on the carrier. In the protection film forming step, in a state where any one or more of the element chip are held spaced from each other on the carrier, the protection film is formed selectively on the side surface of the element chip by exposing the element chip to a second plasma that is generated during supplying protection film forming gas.

A method of manufacturing an element chip of the disclosure is a method of manufacturing an element chip, in which a plurality of element chips are formed by dividing a substrate including a first surface having a plurality of element regions that are defined by dividing regions and a second surface on a side opposite to the first surface into the dividing regions, and has the following features. The method of manufacturing the element chip includes a preparing step and a plasma processing step that is performed after the preparing step. The preparing step is a step of preparing the substrate in which a second surface side is supported on a carrier and an etching-resistant layer is formed so as to cover the element regions and to expose the dividing regions. The plasma processing step is a step of performing plasma processing on the substrate that is supported on the carrier and includes a dividing step and the protection film forming step that is performed after the dividing step. In the dividing step, the substrate is divided into the element chips by etching the substrate of regions that are not covered by the etching-resistant layer in a depth direction of the substrate up to the second surface by exposing the first surface to the first plasma. Therefore, the element chip including the first surface, the second surface, and the side surface connecting the first surface and the second surface is in a state of being held spaced from each other on the carrier. In the protection film forming step, a protection film is formed selectively on the side surface of any one or more of the element chips by exposing the element chips to second plasma generated during supplying of protection film forming gas in a state where the element chips are held spaced from each other on the carrier.

An element chip of the disclosure is an element chip including a first surface including element regions, a second surface on a side opposite to the first surface, and a side surface connecting the first surface and the second surface, and has the following features. That is, the side surface is covered by a protection film, a corner portion between any one of the first surface and the second surface, and the side surface is an obtuse angle, and any one surface being in contact with the side surface via the corner portion is not covered by the protection film.

According to the disclosure, it is possible to suppress creep-up of a conductive material in the mounting step.

BRIEF DESCRIPTION OF THE DRAWINGS

FIG. 6A is an explanatory view of a configuration of the element chip that is manufactured by the first example in the method of manufacturing the element chip of an embodiment of the disclosure;

FIG. 6B is an explanatory view of a configuration of the element chip that is manufactured by the first example in the method of manufacturing the element chip of an embodiment of the disclosure;

FIG. 6C is an explanatory view of a configuration of the element chip that is manufactured by the first example in the method of manufacturing the element chip of an embodiment of the disclosure;

DETAILED DESCRIPTION

Prior to the description of an embodiment of the disclosure, problems in the device of the related art will be briefly described.

As described above, in a case where the element chip such as the WLCSP is sent to an electronic component mounting step as it is, the element chip is mounted in a manner in which the circuit-formed surface comes directly into contact with the conductive material such as cream solder or silver paste for bonding. In the mounting step, the conductive material that is pressed and expanded during mounting the element chip is spread not only on the bonding portion of the circuit-formed surface but also on a side surface or a back surface of the element chip, that is, a so-called "creep-up" may occur. The creep-up of the conductive material causes various problems such as causing short-circuit between adjacent electrodes and an increase in current consumption by forming an unnecessary electric circuit on the side surface of the element chip. Therefore, it is required to suppress the creep-up of the conductive material in the mounting step.

Next, an embodiment of the disclosure will be described with reference to the drawings.

First Example

First, a first example in a method of manufacturing an element chip of the embodiment will be described with reference to FIGS. 1A to 1C and 2A to 2C. Here, the method of manufacturing the element chip is configured such that a plurality of element chips are formed by dividing a substrate including a first surface having a plurality of element regions that are defined by dividing regions and a second surface on a side opposite to the first surface into the dividing regions.

Figure 1A:
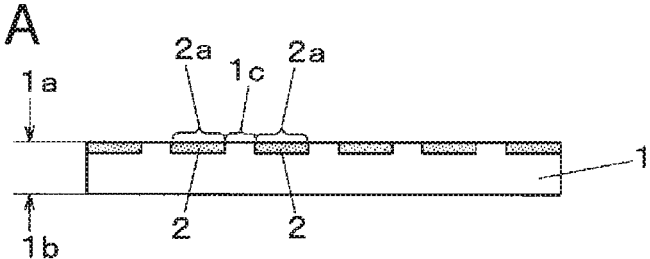
FIG. 1A is an explanatory view of a step of a first example in a method of manufacturing an element chip of an embodiment of the disclosure.

As illustrated in FIG. 1A, substrate 1 is a wafer substrate where a plurality of element chips 10 (see FIG. 1C) having element portions 2 are created. A plurality of element regions 2a defined by dividing regions 1c are set in first surface 1a in substrate 1 that is an element surface in which an element portion 2 is formed. Substrate 1 is sent to a preparing step for manufacturing the element chips and, as described below, support is performed by carrier 4 and mask formation is performed. As carrier 4, a dicing tape that is held by a dicing frame or a support substrate that includes adhesive layer in holding surface 4a may be exemplified.

Figure 1B:
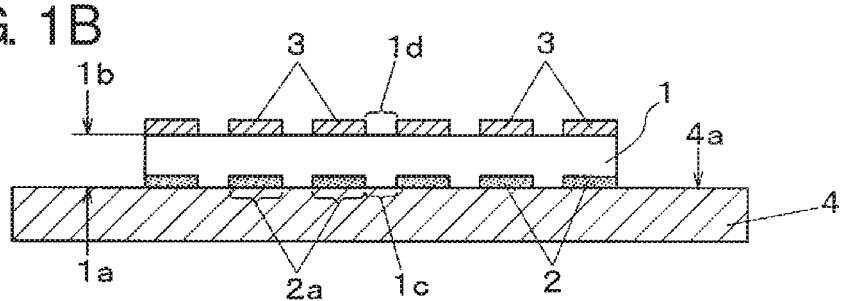
FIG. 1B is an explanatory view of a step of the first example in the method of manufacturing the element chip of an embodiment of the disclosure.

In the preparing step, as illustrated in FIG. 1B, etching-resistant layer 3 that functions as a mask in plasma dicing is formed in second surface 1b. That is, etching-resistant layers 3 are formed in second surface 1b so as to cover regions of second surface 1b facing element regions 2a and expose regions 1d of second surface 1b facing dividing regions 1c. First surface 1a side of substrate 1 is supported on holding surface 4a of carrier 4. In the preparing step, the mask formation may be performed before being supported by carrier 4 or after being supported by carrier 4.

Figure 3:
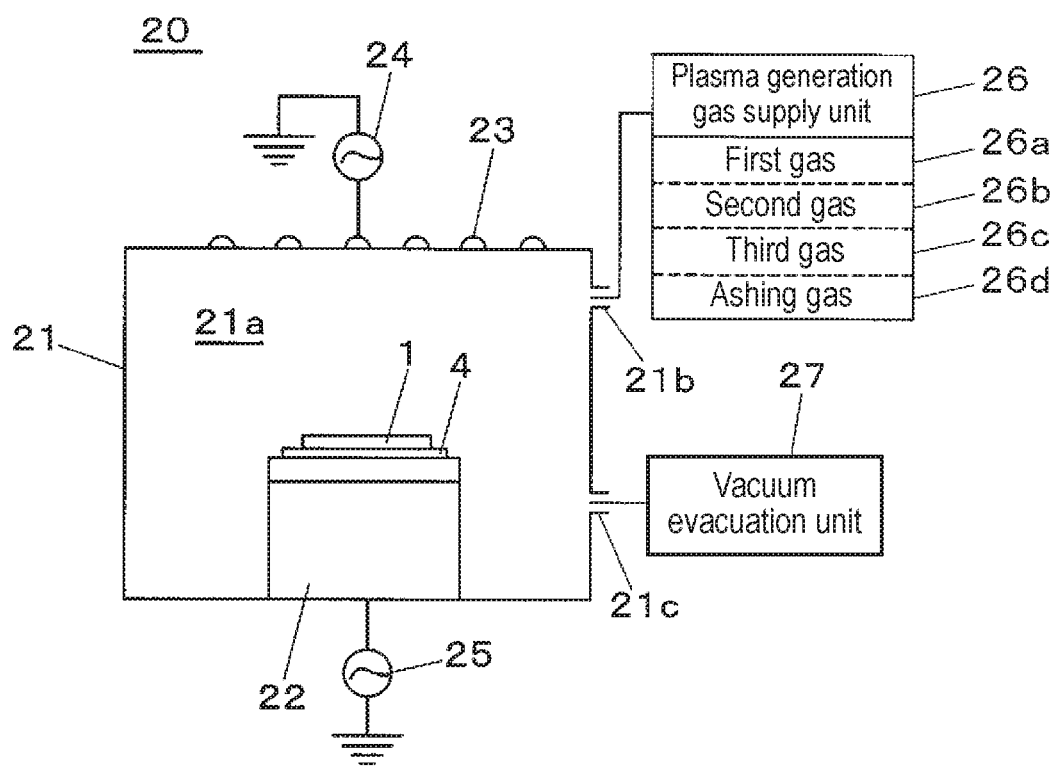
FIG. 3 is an explanatory view of a configuration of a plasma etching device that is used in the method of manufacturing the element chip of an embodiment of the disclosure.

After performing the preparing step as described above, in order to perform plasma processing on substrate 1 that is supported on carrier 4, carrier 4 is sent to a plasma processing step. A configuration of plasma etching device 20 that is used in the plasma processing step will be described with reference to FIG. 3. In FIG. 3, an inside of chamber 21 that is a vacuum vessel is processing chamber 21a for performing plasma processing and stage 22, on which carrier 4 supporting substrate 1 that is to be processed is mounted, is disposed on a bottom portion of processing chamber 21a. Antennas 23 as upper electrodes are disposed on an upper surface of a top portion of chamber 21 and antenna 23 is electrically connected to first high-frequency power supply unit 24. Stage 22 within processing chamber 21a also has a function as a lower electrode for performing plasma processing and stage 22 is electrically connected to second high-frequency power supply unit 25.

Vacuum evacuation unit 27 is connected to chamber 21 via exhaust port 21c and the inside of processing chamber 21a is evacuated by driving vacuum evacuation unit 27. Furthermore, plasma generation gas supply unit 26 is connected to processing chamber 21a via gas inlet port 21b. In plasma etching device 20 illustrated in the embodiment, it is possible to selectively supply a plurality of types of plasma generation gas depending on the purpose of plasma processing. Here, as the types of plasma generation gas, first gas 26a, second gas 26b, third gas 26c, and ashing gas 26d may be selected.

As first gas 26a, gas such as $SF_6$ which is excellent in etching effect for silicon as a target is used. In the embodiment, first gas 26a is used for generating first plasma P1 to divide substrate 1 by plasma etching. As second gas 26b, gas containing fluorocarbon such as $C_4F_8$, $C_2F_6$, $CF_4$, $C_6F_6$, $C_6F_4H_2$, $CHF_3$, and $CH_2F_2$ is used. These types of gas are used as gas for a plasma CVD that forms a film using a plasma processing and, in the embodiment, are used for the purpose of forming a protection film on a side surface of element chips 10 that are obtained by dividing substrate 1. Helium or argon (Ar) may be added to second gas 26b. That is, second gas 26b is gas for forming a protection film and, in the embodiment, gas for forming the protection film has a composition containing fluorocarbon.

As third gas 26c, gas which is excellent in physical etching effect such as $SF_6$ gas, oxygen gas, and argon gas is used. In the embodiment, third gas 26c is used for sputtering for removing an unnecessary portion among the protection film described above. Ashing gas 26d is oxygen gas and, in the embodiment, is used for the purpose of removing a resist film such as etching-resistant layer 3 after completion of a mask function.

In plasma processing by plasma etching device 20, first, substrate 1 to be processed is mounted on stage 22 together with carrier 4 and the inside of processing chamber 21a is excavated to be vacuum by driving vacuum evacuation unit 27. At the same time, plasma generation gas depending on the purpose of plasma processing is supplied on the inside of processing chamber 21a by plasma generation gas supply unit 26 and the inside of processing chamber 21a is maintained at a predetermined pressure. In this state, high-frequency power is supplied on antenna 23 by first high-frequency power supply unit 24 and thereby plasma according to the type of plasma generation gas, which is supplied, is generated on the inside of processing chamber 21a. In this case, a bias voltage is applied to stage 22 as the lower electrode by second high-frequency power supply unit 25. Therefore, it is possible to exert a biasing effect for promoting entry of plasma generated on the inside of processing chamber 21a in a direction of stage 22 and to perform anisotropic etching by enhancing a plasma processing effect in a desired specific direction.

Figure 1C:
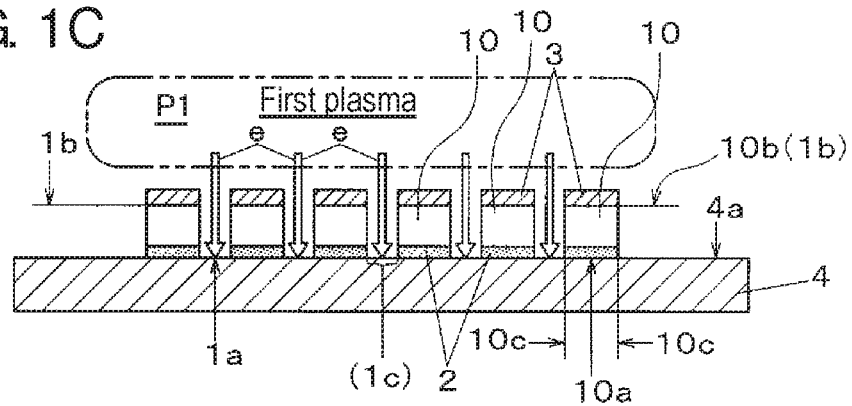
FIG. 1C is an explanatory view of a step of the first example in the method of manufacturing the element chip of an embodiment of the disclosure.

In the plasma processing step, first, processing is executed by first plasma P1 using first gas 26a described above. As illustrated in FIG. 1C, substrate 1 of regions 1d (see FIG. 1B) which are not covered by etching-resistant layer 3 are etched (see arrows e) until reaching first surface 1a in the depth direction of substrate 1 by exposing second surface 1b of substrate 1 to first plasma P1 described above. Etching grooves 11 (see FIG. 2A) separating each element chip 10 are formed, and substrate 1 is divided into element chips 10 of individual pieces. That is, element chips 10 including first surface 10a that is first surface 1a, second surface 10b that is second surface 1b in the state of substrate 1, and side surface 10c connecting first surface 10a and second surface 10b are in a state of being held spaced from each other on carrier 4 (dividing step).

Etching conditions in the dividing step can be appropriately selected depending on a material of substrate 1. In a case where substrate 1 is a silicon substrate, for etching in the dividing step, a so-called Bosch process can be used. In the Bosch process, it is possible to burrow the region 1d that is not covered by etching-resistant layer 3 perpendicular to the depth direction of the substrate by sequentially repeating a deposition film depositing step, a deposition film etching step, and a silicon etching step.

As conditions of the deposition film depositing step, for example, a pressure on the inside of processing chamber 21a is adjusted to 15 to 25 Pa while supplying $C_4F_8$ as raw material gas at 150 to 250 sccm, input power from first high-frequency power supply unit 24 to antenna 23 is 1500 to 2500 W, input power from second high-frequency power supply unit 25 to the lower electrode is 0 W, and a processing time may be 5 to 15 seconds. As conditions of the deposition film etching step, for example, the pressure on the inside of processing chamber 21a is adjusted to 5 to 15 Pa while supplying $SF_6$ as raw material gas at 200 to 400 sccm, input power from first high-frequency power supply unit 24 to antenna 23 is 1500 to 2500 W, input power from second high-frequency power supply unit 25 to the lower electrode is 100 to 300 W, and the processing time may be 2 to 10 seconds. Here, sccm is a unit indicating the amount of flow of a gas. That is, 1 sccm indicates the amount of flow of a gas that flows by 1 $cm^3$ per minute at 0° C. and 1 atmosphere (standard condition).

As conditions of the silicon etching step, for example, the pressure on the inside of processing chamber 21a is adjusted to 5 to 15 Pa while supplying $SF_6$ as raw material gas at 200 to 400 sccm, input power from first high-frequency power supply unit 24 to antenna 23 is 1500 to 2500 W, input power from second high-frequency power supply unit 25 to the lower electrode is 50 to 200 W, and the processing time may be 10 to 20 seconds. In these conditions, it is possible to burrow the silicon substrate at a speed of 10 µm/min by repeating the deposition film depositing step, the deposition film etching step, and the silicon etching step.

Figure 2A:
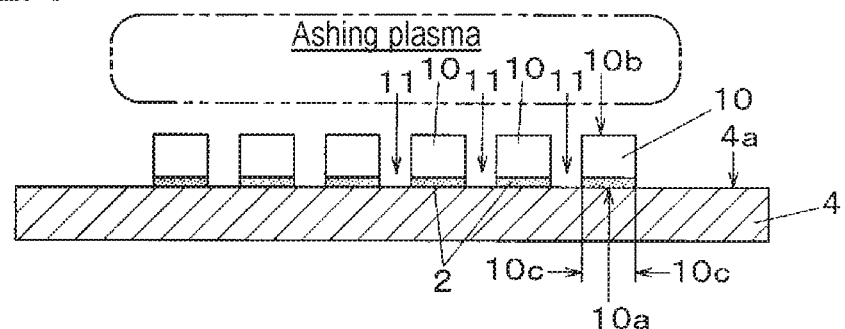
FIG. 2A is an explanatory view of a step of the first example in the method of manufacturing the element chip of an embodiment of the disclosure.

Thereafter, ashing is performed for removing etching-resistant layer 3 of a state where second surface 10b is covered in element chip 10 of an individual piece. That is, as illustrated in FIG. 2A, ashing using ashing gas 26d is generated on the inside of processing chamber 21a in plasma etching device 20 and etching-resistant layer 3 that is formed mainly of resin is removed by ashing. Therefore, second surfaces 10b of element chips 10 divided into individual pieces are in a state of being exposed.

Conditions of ashing can be appropriately selected in accordance with a material of etching-resistant layer 3. For example, in a case where etching-resistant layer 3 is a resist film, the pressure on the inside of processing chamber 21a is adjusted to 5 to 15 Pa while supplying oxygen at 150 to 250 sccm and supplying $CF_4$ at 0 to 50 sccm as raw material gas, input power from first high-frequency power supply unit 24 to antenna 23 is 1500 to 2500 W, input power from second high-frequency power supply unit 25 to the lower electrode may be 0 to 30 W. In the conditions, it is possible to remove etching-resistant layer 3 at a speed of appropriately 1 µm/min.

Figure 2B:
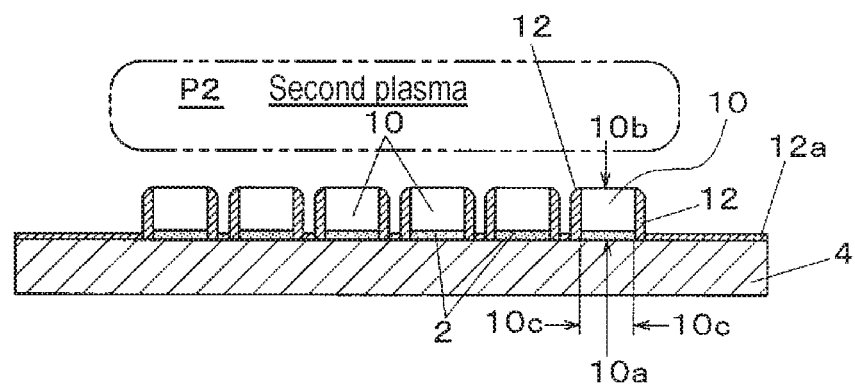
FIG. 2B is an explanatory view of a step of the first example in the method of manufacturing the element chip of an embodiment of the disclosure.

Next, after the dividing step described above, a protection film forming step is performed. Here, in plasma etching device 20, second gas 26b that is gas for the protection film formation, that is, second plasma P2 using gas containing fluorocarbon is generated on the inside of processing chamber 21a and, as illustrated in FIG. 2B, element chips 10 are exposed by second plasma P2 in a state of being held spaced from each other on carrier 4. Therefore, protection film 12 is formed in a predetermined portion of element chip 10. In the embodiment, plasma processing conditions are set such that protection film 12 is formed only in side surface 10c of element chip 10 in the protection film forming step.

On a surface of element chip 10, a deposition reaction in which a reaction product that is generated by second plasma P2 is deposited on the surface of element chip 10 as protection film 12 and a removal reaction in which ions and radicals contained in second plasma P2 remove protection film 12 that is deposited on the surface of element chip 10 are proceeded at the same time. In this case, the deposition reaction and the removal reaction are antagonized or the removal reaction is superior to the deposition reaction in second surface 10b and, on the other hand, the deposition reaction is dominant than the removal reaction in side surface 10c. Therefore, it is possible to form protection film 12 only in side surface 10c without depositing protection film 12 on second surface 10b.

Specifically, for example, in the protection film forming step, a high-frequency bias is applied to stage 22 (see FIG. 3) on which carrier 4 is mounted. Therefore, incidence of ions from vertically above to element chip 10 is facilitated and it is possible to cause the removal reaction to antagonize the deposition reaction in second surface 10b. In this case, since the ions is unlikely to be incident in side surface 10c compared to second surface 10b, the removal reaction is unlikely to occur and, as a result, the deposition reaction is dominant.

In the embodiment, a case where protection film 12 is formed only on side surface 10c by applying the high-frequency bias is described, but protection film 12 may be formed only on side surface 10c by adjusting parameters such as types and pressures of gas other than the high-frequency bias.

Protection films 12 are formed for the purpose of suppressing creep-up of the conductive material in the mounting process for directly bonding element chip 10 to the package substrate and the like. Therefore, it is preferable that the protection films have less hygroscopicity and dense composition. In the embodiment, as raw material gas of second plasma P2 used for forming the protection films 12, since gas containing fluorocarbon is used, a film including mainly fluorocarbon containing fluorine and carbon is formed as protection film 12, and it is possible to form the protection film which has less hygroscopicity and dense composition, and excellent in adhesion.

In the protection film forming step, carrier 4 applies the high-frequency bias to stage 22 (see FIG. 3) on which carrier 4 is mounted. Therefore, the incidence of the ions from vertically above to element chip 10 is facilitated and it is possible to form protection film 12 that is denser and has high adhesion.

As conditions of the protection film formation, for example, the pressure on the inside of processing chamber 21a is adjusted to 1 Pa while supplying $C_4F_8$ at 140 sccm, He at 30 sccm, and Ar at 30 sccm as raw material gas, input power from first high-frequency power supply unit 24 to antenna 23 is 1500 to 2500 W, input power from second high-frequency power supply unit 25 to the lower electrode may be 100 to 300 W. In the conditions, it is possible to form the protection film having a thickness of 1 μm only on side surface 10c by being processed for 300 seconds. In this case, it is possible to cause the deposition reaction of the protection film and the removal reaction of the protection film on the surface of second surface 10b to be in a state of being antagonized, and to form the protection film only on side surface 10c without forming the protection film on second surface 10b.

In the embodiment, as raw material gas, helium is used and this is because dissociation of raw material gas is promoted in plasma by mixing helium and, as a result, it is possible to form the protection film which is dense and has high adhesion.

In the condition examples described above, the ratio of the flow ratio of He to the total flow rate of raw material gas is 15%. As described below, it is preferable that the ratio is between 10% and 80%. That is, if the ratio of the flow ratio of He to the total flow rate of raw material gas is greater than 10%, the dissociation of raw gas is easily facilitated in the plasma and, as a result, it is possible to form the protection film which is further dense and has high adhesion. On the other hand, if the ratio of the flow ratio of He to the total flow rate of raw material gas is greater than 80%, the ratio of $C_4F_8$ occupied in raw material gas is reduced. Therefore, supply of components (C, F, and compounds thereof) in plasma contributing to the protection film formation to the surface of the substrate is insufficient, a deposition rate of the protection film on the surface of the substrate is slow, and productivity is lowered.

Figure 2C:
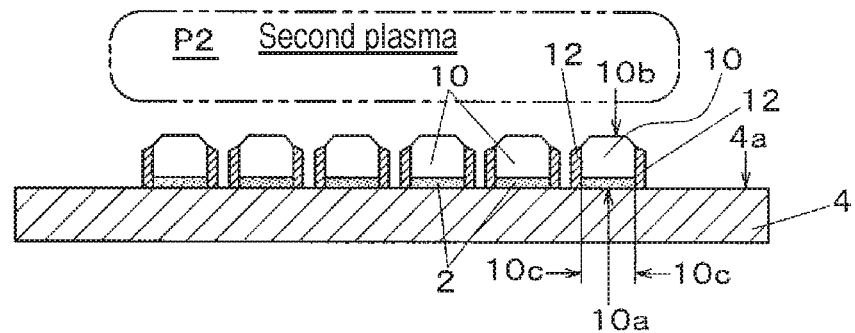
FIG. 2C is an explanatory view of a step of the first example in the method of manufacturing the element chip of an embodiment of the disclosure.

FIG. 2C illustrates an example (protection film forming step (2)) in which corner portion E (see FIG. 6C) between second surface 10b and side surface 10c of element chip 10 is cut to an obtuse angle in the protection film forming step described above. That is, in this case, as described above, the high-frequency bias is applied to stage 22 on which carrier 4 is mounted. Therefore, the ions are incident from vertically above to element chip 10, adhesion of protection film 12 to second surface 10b is suppressed, and it is possible to promote a cutting operation of corner portion E to the obtuse angle.

In this case, a ratio of physical sputtering is increased in an etching reaction due to the incidence of the ions by using a mixed gas containing argon as protection film forming gas. Therefore, it is possible to suppress the adhesion of protection film 12 to second surface 10b and further enhance the cutting operation of corner portion E to the obtuse angle. In the condition examples described above, a ratio of a argon flow ratio with respect to an entire flow rate of raw material gas is 15%. It is preferable that the ratio is between 10% and 30%.

Second Example

Next, a second example in the method of manufacturing the element chip of the embodiment will be described with reference to FIGS. 4A to 4C and 5A to 5C. Here, the method of manufacturing the element chip illustrated in the second example is configured similar to that of the first example in which a plurality of element chips are formed by dividing a substrate, which includes a first surface having a plurality of element regions that are defined into dividing regions and a second surface on a side opposite to the first surface, into the dividing regions.

Figure 4A:
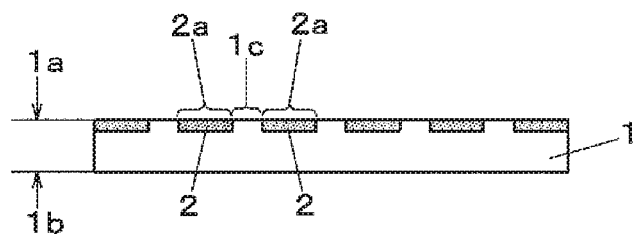
FIG. 4A is an explanatory view of a step of the second example in the method of manufacturing the element chip of an embodiment of the disclosure.

As illustrated in FIG. 4A, substrate 1 is a wafer substrate in which a plurality of element chips 10 (see FIG. 4C) having element portions 2 are created. A plurality of element regions 2a that are defined by dividing regions 1c are set in first surface 1a that is an element surface on which element portions 2 are formed in substrate 1. Substrate 1 is sent to a preparing step for manufacturing the element chips and, in here, the mask formation and support thereof by carrier 4 are performed as described below. Similar to the first example, as carrier 4, a carrier, which is capable of being handled by fixing substrate 1 which is thin and easily bent, such as an adhesive sheet or a support substrate, is used.

Figure 4B:
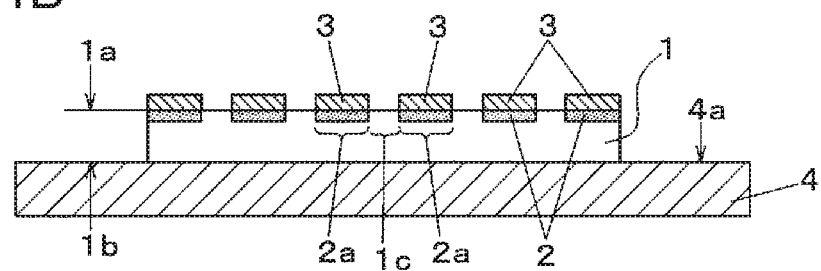
FIG. 4B is an explanatory view of a step of the second example in the method of manufacturing the element chip of an embodiment of the disclosure.

In the preparing step, as illustrated in FIG. 4B, etching-resistant layer 3 functioning as a mask in plasma dicing is formed in first surface 1a. That is, etching-resistant layer 3 is formed on first surface 1a so as to cover the element region 2a and expose dividing regions 1c. A second surface 1b side of substrate 1 is supported on holding surface 4a of carrier 4. The mask formation in the preparing step may be performed before being supported by carrier 4 or may be performed after being supported by carrier 4.

Therefore, since plasma processing is performed on substrate 1 supported by carrier 4 after performing the preparing step, carrier 4 is sent to the plasma processing step. In the plasma processing step, plasma etching device 20 (see FIG. 3) described in the first example is used.

Figure 4C:
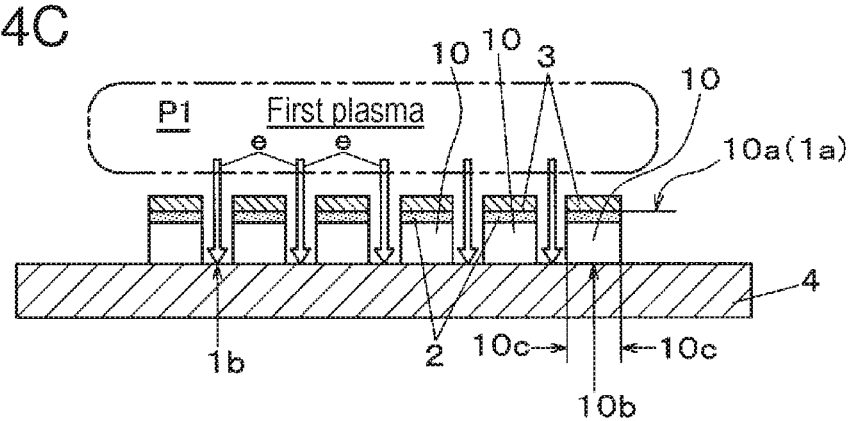
FIG. 4C is an explanatory view of a step of the second example in the method of manufacturing the element chip of an embodiment of the disclosure.

In the plasma processing step, first, processing by first plasma P1 is executed by using first gas 26a. As illustrated in FIG. 4C, etching grooves 11 (see FIG. 5A) separated from each other between element chips 10 are formed and substrate 1 is divided into element chips 10 of individual pieces by etching (see arrow e) substrate 1 of dividing regions 1c (see FIG. 4B) which are not covered by etching-resistant layer 3 in a depth direction of substrate 1 up to second surface 1b by exposing first surface 1a of substrate 1 to first plasma P1. That is, element chip 10 including first surface 10a that is first surface 1a in a state of substrate 1, second surface 10b that is second surface 1b, and side surface 10c connecting first surface 10a and second surface 10b is in a state of being held spaced from each other on carrier 4 (dividing step).

Figure 5A:
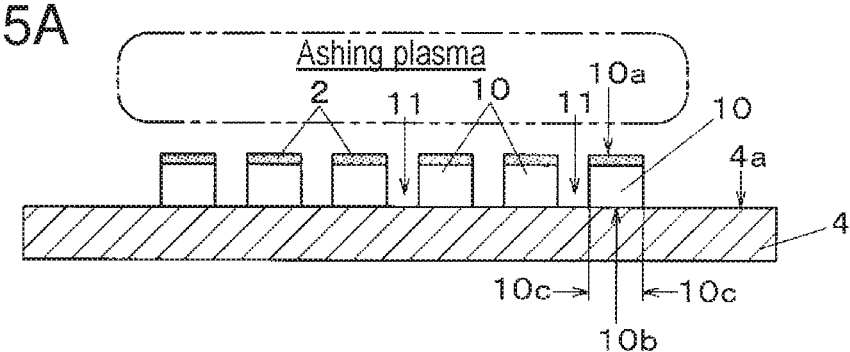
FIG. 5A is an explanatory view of a step of the second example in the method of manufacturing the element chip of an embodiment of the disclosure.

Thereafter, ashing for removing etching-resistant layer 3 of a state of covering second surface 10b is performed in element chip 10 of individual piece. That is, as illustrated in FIG. 5A, ashing plasma for ashing is generated by using ashing gas 26d on the inside of processing chamber 21a in plasma etching device 20. Etching-resistant layer 3 containing mainly resin is removed by the ashing. Therefore, second surfaces 10b of element chips 10 that are divided into individual pieces are in a state of being exposed.

Figure 5B:
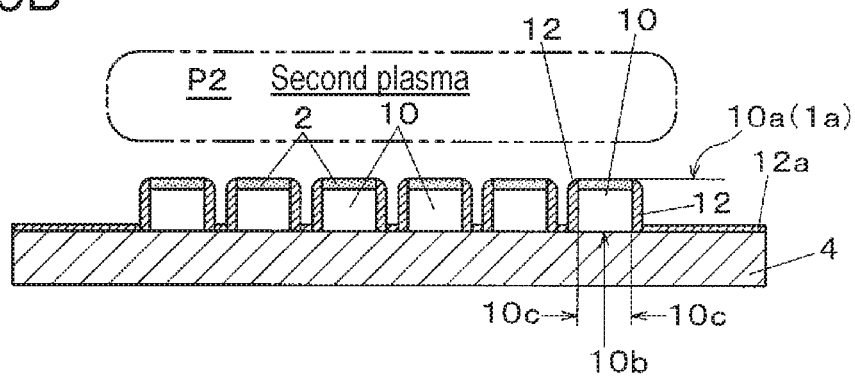
FIG. 5B is an explanatory view of a step of the second example in the method of manufacturing the element chip of an embodiment of the disclosure.

Next, the protection film forming step is executed after the dividing step described above. Here, in plasma etching device 20, second plasma P2 using second gas 26b that is protection film forming gas, that is, gas containing fluorocarbon is generated on the inside of processing chamber 21a and, as illustrated in FIG. 5B, in a case where element chips 10 are held spaced from each other on carrier 4, element chips 10 are exposed by second plasma P2. Therefore, protection film 12 is formed in a predetermined portion of element chip 10. In the embodiment, in the protection film forming step, the plasma processing conditions are set so as to form protection film 12 only on side surface 10c of element chip 10.

In the formation of the protection films, advantages and effects obtained by using gas containing fluorocarbon as raw material gas of second plasma P2 are the same as those of the first example. Similar to the first example, helium or argon may be added to raw material gas of second plasma P2 and the advantages and effects accordingly are also the same as those of the first example. In the protection film forming step, the high-frequency bias is applied to the stage on which carrier 4 is mounted. Therefore, the incidence of the ions on element chip 10 is promoted and it is possible to form the protection film that is denser and has high adhesion.

Figure 5C:
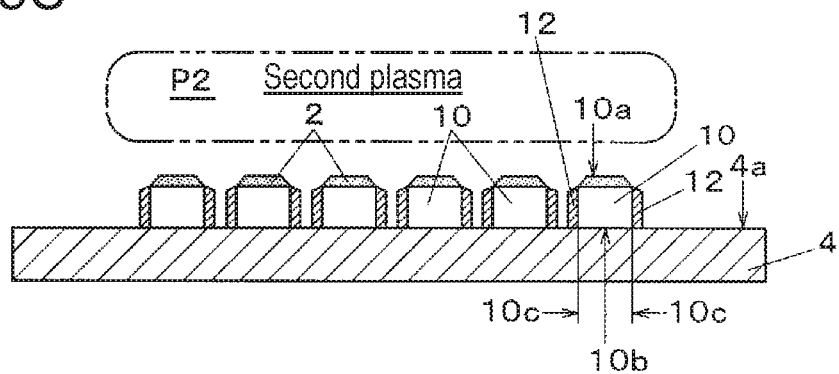
FIG. 5C is an explanatory view of a step of the second example in the method of manufacturing the element chip of an embodiment of the disclosure.

FIG. 5C illustrates an example (protection film forming step (2)) in which corner portion E (see FIG. 7C) between first surface 10a and side surface 10c of element chip 10 is cut to the obtuse angle. That is, in this case, similar to the first example, the high-frequency bias is applied to stage 22 on which carrier 4 is mounted. Therefore, the ions are incident from vertically above to element chip 10, adhesion of protection film 12 to first surface 10a is suppressed, and it is possible to promote the cutting operation of corner portion E to the obtuse angle. In this case, the ratio of the physical sputtering is increased in the etching reaction by the incidence of the ions, it is possible to suppress the adhesion of protection film 12 to first surface 10a and to further enhance the cutting operation of corner portion E to the obtuse angle by using mixed gas containing argon as protection film forming gas.

FIGS. 6A to 6C illustrate variation of element chip 10 manufactured by a manufacturing step illustrated in the first example. Element chip 10A illustrated in FIG. 6A indicates element chip 10 after the protection film forming step illustrated in FIG. 2B. Here, protection film 12 is formed only on side surface 10c and first surface 10a and second surface 10b are not cover by protection film 12. Element chip 10B illustrated in FIG. 6B is obtained by removing an upper end portion of protection film 12 formed on side surface 10c and forming exposed portion 10e in which the upper end portion of side surface 10c is exposed in element chip 10 after the protection film forming step illustrated in FIG. 2B.

Element chip 10C illustrated in FIG. 6C illustrates element chip 10 after the protection film forming step (2) illustrated in FIG. 2C and is obtained by removing an end portion of exposed portion 10e in which the upper end portion of side surface 10c is exposed by etching and forming corner cut portion 10e*. That is, in element chip 10C, side surface 10c is covered by protection film 12, corner portion E between second surface 10b and side surface 10c is removed by the etching to be the obtuse angle, and second surface 10b connected to side surface 10c via corner portion E is not covered by protection film 12.

Figure 7A:
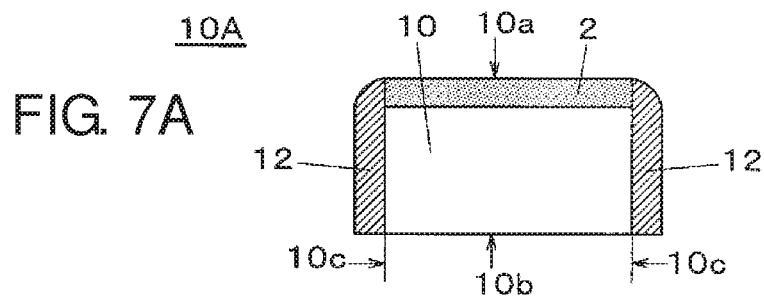
FIG. 7A is an explanatory view of the element chip that is manufactured by the second example in the method of manufacturing the element chip of an embodiment of the disclosure.
Figure 7B:
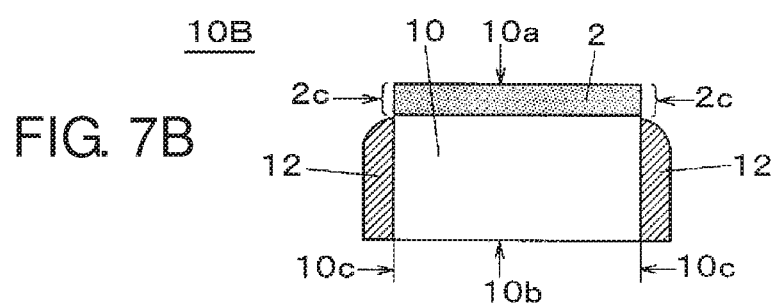
FIG. 7B is an explanatory view of the element chip that is manufactured by the second example in the method of manufacturing the element chip of an embodiment of the disclosure.
Figure 7C:
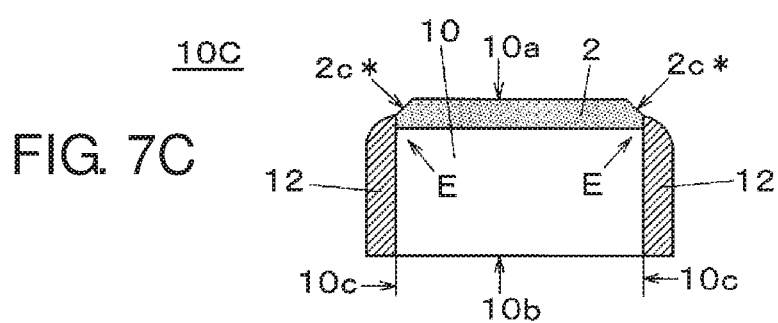
FIG. 7C is an explanatory view of the element chip that is manufactured by the second example in the method of manufacturing the element chip of an embodiment of the disclosure.

FIGS. 7A to 7C illustrate the variation of element chip 10 manufactured by a manufacturing step illustrated in the second example. Element chip 10A illustrated in FIG. 7A illustrates element chip 10 after the protection film forming step illustrated in FIG. 5B. Here, protection film 12 is formed only on side surface 10c and first surface 10a and second surface 10b are not covered by protection film 12. Element chip 10B illustrated in FIG. 6B is configured such that exposed portion 2c, in which a side end portion of element portion 2 created in the upper end portion of first surface 10a is exposed, is formed in element chip 10 after the protection film forming step illustrated in FIG. 5B.

Element chip 10C illustrated in FIG. 7C indicates element chip 10 after the protection film forming step (2) illustrated in FIG. 5C and is configured such that corner cut portion 2c* is formed by removing the end portion of exposed portion 2c by the etching. That is, element chip 10C is configured such that side surface 10c is covered by protection film 12, corner portion E between first surface 10a and side surface 10c is removed by the etching to be the obtuse angle, first surface 10a being in contact with side surface 10c via corner portion E is not covered by protection film 12.

In element chips 10A to 10C having the configuration described above illustrated in the first example and the second example, protection film 12, which has surface properties suppressing spreading of a conductive adhesive material in a range in which the conductive material is in contact with side surface 10c in the mounting step, is formed. Therefore, it is possible to suppress the creep-up of the conductive material in the mounting step. Therefore, in the mounting step of bonding element chip 10 to the object to be mounted such as printed substrate via the conductive material, it is possible to improve mounting quality by excluding various problems that may cause the creep-up of the conductive material to side surface 10c to occur. For example, it is possible to improve the mounting quality by excluding various causes of problems such as short circuit between adjacent electrodes or an increase in current consumption due to the formation of an unnecessary electric circuit in side surface 10c of element chip 10.

In element chip 10C illustrated in the first example and the second example, corner cut portion 10e* and corner cut portion 2c* having a shape, in which corner portion E between one of first surface 10a and second surface 10b, and side surface 10c is the obtuse angle, is formed. Therefore, an acute-angle shape in which stress concentration is likely to occur is excluded and it is possible to improve a flexural strength of element chip 10.

In the configuration described above, element chip 10 is in a state where any one surface connecting to side surface 10c via corner portion E is not covered by protection film 12. In element chip 10 having the configuration described above, protection film 12 is formed only on side surface 10c and thereby it is possible to suppress the charge of element chip 10 due to formation of protection film 12 on first surface 10a and second surface 10b. Therefore, it is possible to prevent problems that occur in the element chip mounting step due to the charge of element chip 10, for example, problems that the element chip is prevented from being normally picked up by adhering to a cover tape by the charge in a pocket within a carrier tape that is used in a tape feeder, and the like.

The method of manufacturing an element chip and an element chip of the disclosure have the effect that creep-up of the conductive material can be suppressed in the mounting step and are useful in a field of manufacturing the element chips by dividing the substrate having the plurality of element regions for each of the element regions.

What is claimed is:

1. A method of manufacturing an element chip, in which a plurality of element chips are formed by dividing a substrate, which includes a first surface having a plurality of element regions defined by dividing regions, and a second surface on a side opposite to the first surface, at the dividing regions, the method comprising:
    a preparing step of preparing the substrate in which a first surface side of the substrate is supported on a carrier and an etching-resistant layer is formed so as to cover regions of the second surface opposite to the element regions and to expose regions of the second surface opposite to the dividing regions; and
    a plasma processing step of performing plasma processing on the substrate that is supported on the carrier after the preparing step,
    wherein the plasma processing step includes
    a dividing step of dividing the substrate into the element chips by etching the substrate of regions which are not covered by the etching-resistant layer in a depth direction of the substrate up to the first surface by exposing the second surface to first plasma and causing the element chips including the first surface, the second surface, and a side surface connecting the first surface and the second surface to be in a state of being held spaced from each other on the carrier,
    an ashing step of removing the etching-resistant layer, and
    a protection film forming step of forming a protection film selectively on the side surface of any one or more of the element chips by exposing the element chips to second plasma generated during supplying of protection film forming gas in a state where the element chips are held spaced from each other on the carrier after the dividing step,
    wherein in the protection film forming step, a high-frequency bias is applied to a stage on which the carrier is mounted, and
    wherein the ashing step is performed after the dividing step and before the protection film forming step.

2. The method of manufacturing an element chip of claim 1,
    wherein in the protection film forming step, a corner portion between the second surface and the side surface is chamfered to form a corner cut portion.

3. The method of manufacturing an element chip of claim 2, wherein the corner cut portion is connected to the second surface and the side surface at an obtuse interior angle.

4. The method of manufacturing an element chip of claim 1,
    wherein the protection film is a film containing mainly fluorocarbon.

5. The method of manufacturing an element chip of claim 4,
    wherein the protection film forming gas contains fluorocarbon.

6. The method of manufacturing an element chip of claim 1,
    wherein the protection film forming gas contains argon.

7. A method of manufacturing an element chip, in which a plurality of element chips are formed by dividing a substrate, which includes a first surface having a plurality of element regions defined by dividing regions, and a second surface on a side opposite to the first surface, at the dividing regions, the method comprising:
    a preparing step of preparing the substrate in which a second surface side is supported on a carrier and an etching-resistant layer is formed so as to cover the element regions and to expose the dividing regions; and
    a plasma processing step of performing plasma processing on the substrate that is supported on the carrier after the preparing step,
    wherein the plasma processing step includes
    a dividing step of dividing the substrate into the element chips by etching the substrate of regions which are not covered by the etching-resistant layer in a depth direction of the substrate up to the second surface by exposing the first surface to first plasma and causing the element chips including the first surface, the second surface, and a side surface connecting the first surface and the second surface to be in a state of being held spaced from each other on the carrier,
    an ashing step of removing the etching-resistant layer, and
    a protection film forming step of forming a protection film selectively on the side surface of any one or more of the element chips by exposing the element chips to second plasma generated during supplying of protection film forming gas in a state where the element chips are held spaced from each other on the carrier after the dividing step,
    wherein in the protection film forming step, a high-frequency bias is applied to a stage on which the carrier is mounted, and
    wherein the ashing step is performed after the dividing step and before the protection film forming step.

8. The method of manufacturing an element chip of claim 7, wherein in the protection film forming step, a corner portion between the first surface and the side surface is chamfered to form a corner cut portion.

9. The method of manufacturing an element chip of claim 8, wherein the corner cut portion is connected to the first surface and the side surface at an obtuse interior angle.

10. The method of manufacturing an element chip of claim 7,
wherein the protection film is a film containing mainly fluorocarbon.

11. The method of manufacturing an element chip of claim 10,
wherein the protection film forming gas contains fluorocarbon.

12. The method of manufacturing an element chip of claim 7,
wherein the protection film forming gas contains argon.

* * * * *